United States Patent
Takenaka et al.

(10) Patent No.: US 9,666,740 B2
(45) Date of Patent: May 30, 2017

(54) SOLAR CELL MODULE MANUFACTURING METHOD

(71) Applicant: Panasonic Intellectual Property Management Co., Ltd., Osaka (JP)

(72) Inventors: Masaharu Takenaka, Osaka (JP); Kei Nakamura, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 15/069,977

(22) Filed: Mar. 15, 2016

(65) Prior Publication Data

US 2016/0197219 A1 Jul. 7, 2016

Related U.S. Application Data

(63) Continuation of application No. PCT/JP2014/071615, filed on Aug. 19, 2014.

(30) Foreign Application Priority Data

Sep. 25, 2013 (JP) ................................. 2013-198400

(51) Int. Cl.
*H01L 31/049* (2014.01)
*H01L 31/048* (2014.01)

(52) U.S. Cl.
CPC .......... *H01L 31/049* (2014.12); *H01L 31/048* (2013.01); *Y02E 10/50* (2013.01)

(58) Field of Classification Search
CPC .................... H01L 31/049; H01L 31/048
See application file for complete search history.

(56) References Cited

U.S. PATENT DOCUMENTS

| 6,063,996 | A  | * | 5/2000 | Takada | F24J 2/5235 126/621 |
| 2007/0215197 | A1 | * | 9/2007 | Buller | H01L 31/0203 136/243 |
| 2013/0056044 | A1 | * | 3/2013 | Ravi | H01L 31/048 136/245 |

FOREIGN PATENT DOCUMENTS

| EP | 2390093 A1 * | 11/2011 | ....... B32B 17/10018 |
| JP | H5-5344 A | 1/1993 | |
| JP | 2007-123451 A | 5/2007 | |

OTHER PUBLICATIONS

Shingal, Christina; "Isovoltaic," Innovative Backsheets. Porven Experience, Oct. 9, 2012.*

(Continued)

*Primary Examiner* — Kyoung Lee
*Assistant Examiner* — Christina Sylvia
(74) *Attorney, Agent, or Firm* — Mots Law, PLLC

(57) ABSTRACT

A solar cell module manufacturing method includes: preparing a front-side transparent protective member and a back-side protective sheet member, the front-side transparent protective member including a first principal surface and a second principal surface, a surface area of at least the first principal surface being larger than a projected area of the first principal surface, the back-side protective sheet member including a third principal surface and a fourth principal surface; and disposing a solar cell between the second principal surface of the front-side transparent protective member and the third principal surface of the back-side protective sheet member, and sealing the solar cell with a bonding layer therebetween. A breaking elongation of the back-side protective sheet member is 300% or more.

20 Claims, 4 Drawing Sheets

(56) References Cited

OTHER PUBLICATIONS

P.G.Carey et al., "A Solar Module Fabrication Process for Hale Solar Electric UAVs" First WCPEC; Dec. 5-9, 1994; Hawaii.

* cited by examiner

SOLAR CELL MODULE MANUFACTURING METHOD

CROSS REFERENCE TO RELATED APPLICATIONS

This application is a continuation application of International Application No. PCT/JP2014/071615, filed on Aug. 19, 2014, entitled "SOLAR CELL MODULE MANUFACTURING METHOD", which claims priority based on the Article 8 of Patent Cooperation Treaty from prior Japanese Patent Application No. 2013-198400, filed on Mar. 25, 2013, the entire contents of which are incorporated herein by reference.

BACKGROUND OF THE INVENTION

1. Technical Field

This disclosure relates to a solar cell module manufacturing method.

2. Background Art

There has been proposed a Japanese roof tile type solar cell module using a transparent protective member having a non-planar shape (Patent Literature 1). Furthermore, as a solar cell module using a transparent protective member having a non-planar shape, there has also been considered a solar cell module installed on a wing of an unmanned air vehicle (Non Patent Literature 1).

PATENT LITERATURE

[PTL 1] Japanese Patent Application Publication No. Hei 5-5344

NON PATENT LITERATURE

[NPL 1] A SOLAR MODULE FABRICATION PROCESS FOR HALE SOLAR ELECTRIC UAVs, First WCPEC; Dec. 5-9, 1994; Hawaii

SUMMARY

A solar cell module is generally manufactured by disposing solar cells between a front-side transparent protective member and a back-side protective sheet member, and sealing the solar cells in a bonding layer. When the front-side transparent protective member having a thickness larger than that of the back-side protective sheet member, and having a principal surface whose surface area is larger than its projected area, e.g., having a non-planar shape such as a bent shape, is used, there is a problem that wrinkles are likely to occur on the back-side protective sheet member.

It is an object of an embodiment of the invention to provide a solar cell module manufacturing method, in which wrinkles are less likely to occur on a back-side protective sheet member even with the use of a front-side transparent protective member having opposed principal surfaces with different surface areas.

A first aspect of the invention is a solar cell module manufacturing method that comprises: preparing a front-side transparent protective member and a back-side protective sheet member, the front-side transparent protective member having a first principal surface and a second principal surface, wherein at least the surface area of the first principal surface is larger than the projected area of the first principal surface, the back-side protective sheet member having a third principal surface and a fourth principal surface; and disposing a solar cell between the second principal surface of the front-side transparent protective member and the third principal surface of the back-side protective sheet member, and sealing the solar cell in a bonding layer, wherein the back-side protective sheet member has a thermal contraction rate of 1% or more.

A second aspect of the invention is a solar cell module manufacturing method that comprises: preparing a front-side transparent protective member and a back-side protective sheet member, the front-side transparent protective member having a first principal surface and a second principal surface, wherein at least the surface area of the first principal surface is larger than the projected area of the first principal surface, the back-side protective sheet member having a third principal surface and a fourth principal surface; and disposing a solar cell between the second principal surface of the front-side transparent protective member and the third principal surface of the back-side protective sheet member, and sealing the solar cell in a bonding layer, wherein the back-side protective sheet member has a breaking elongation of 300% or more.

The above aspects of the invention can inhibit occurrence of wrinkles on the back-side protective sheet member.

DESCRIPTION OF EMBODIMENTS

Figure 1:
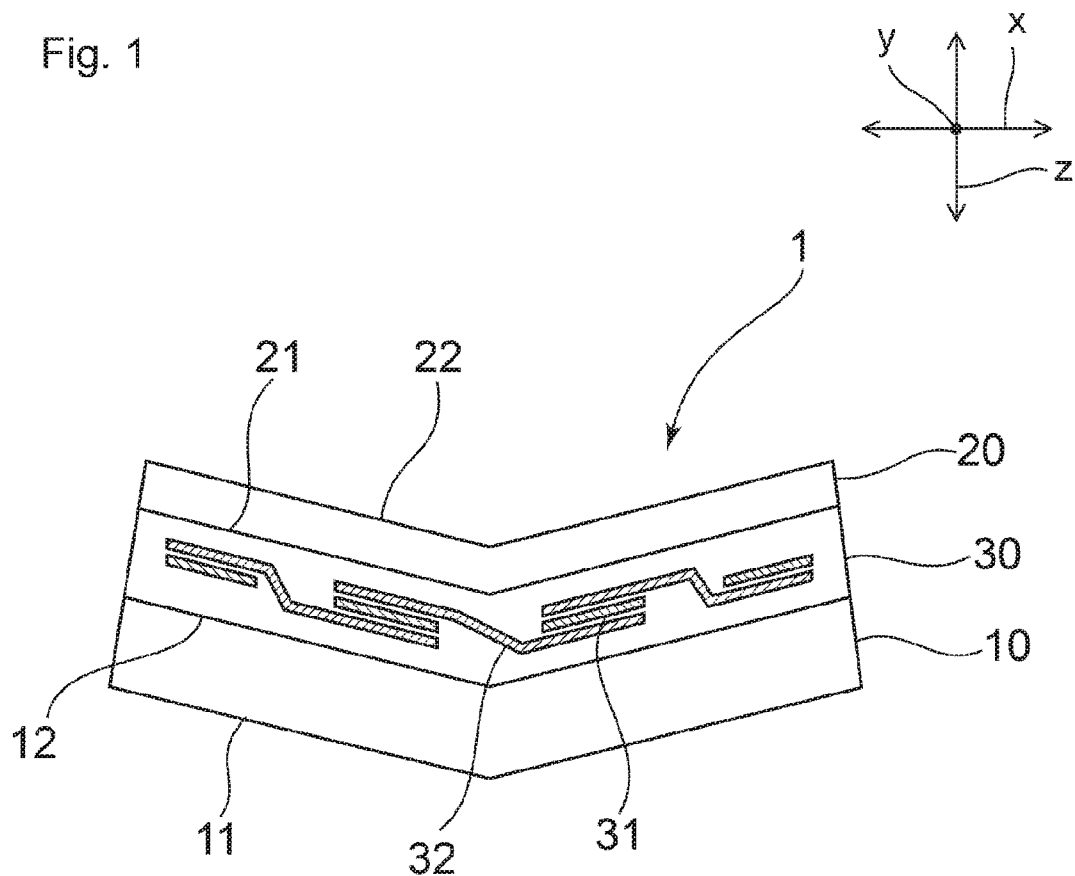
FIG. 1 is a schematic cross-sectional view illustrating a solar cell module according to first and third embodiments.

Hereinafter, preferred embodiments are described. However, the following embodiments are for illustrative purposes only, and the invention is not limited to the following embodiments. Moreover, in the respective drawings, members having substantially the same functions may be denoted by the same reference numerals.

(First Embodiment)

FIG. 1 is a schematic cross-sectional view illustrating a solar cell module according to a first embodiment. As illustrated in FIG. 1, solar cell module 1 of this embodiment uses front-side transparent protective member 10 having a shape that protrudes in a z-direction and is bent along an x-direction. Front-side transparent protective member 10 has first principal surface 11 to be a light-receiving surface and second principal surface 12 to be a back surface. First principal surface 11 and second principal surface 12 are opposed to each other.

Figure 2A:
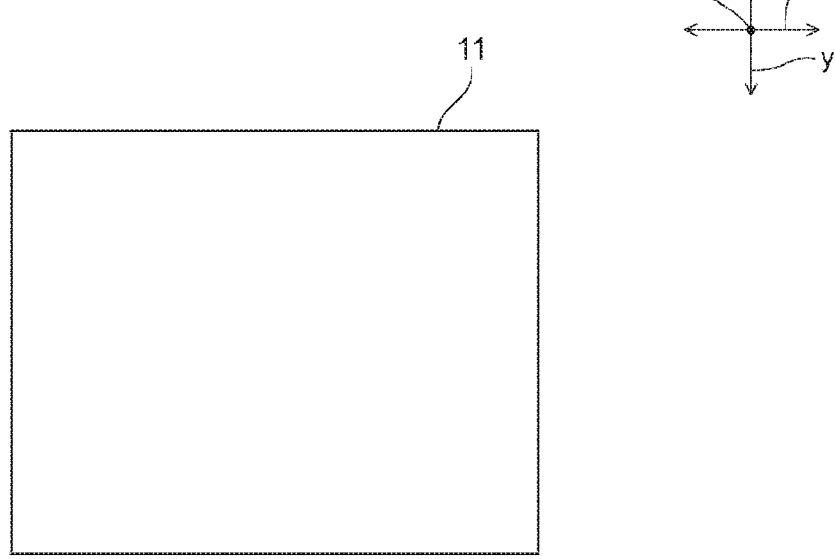
FIG. 2A is a projection view and FIG. 2B is a side view, illustrating a first principal surface of a front-side transparent protective member according to the first and third embodiments.
Figure 2B:
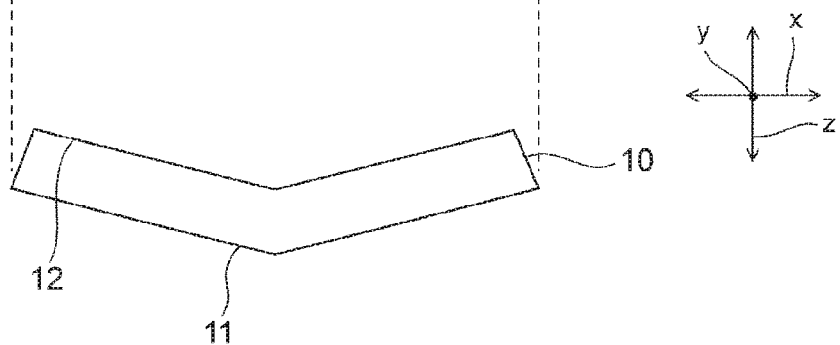

FIG. 2A is a projection view and FIG. 2B is a side view, illustrating first principal surface 11 of front-side transparent protective member 10 according to the first embodiment. FIG. 2A illustrates a projected area of first principal surface 11 of front-side transparent protective member 10. The surface area of first principal surface 11 of front-side transparent protective member 10 is larger than the projected area of first principal surface 11. In this embodiment, first principal surface 11 and second principal surface 12 have approximately the same bent shape. In this embodiment, the surface area of first principal surface 11 of front-side transparent protective member 10 is larger than that of second principal surface 12. Furthermore, front-side transparent protective member 10 has a shape with two ends in the x-direction illustrated in FIG. 2, the two ends being such that a tangent line to one of the ends of first principal surface 11 (second principal surface 12) does not coincide with a tangent line to the other end of first principal surface 11 (second principal surface 12), and slopes of the respective tangent lines are different.

In solar cell module 1 of this embodiment, as illustrated in FIG. 1, bonding layer 30 is provided between second principal surface 12 of front-side transparent protective member 10, which has a bent shape, and third principal surface 21 of back-side protective sheet member 20. In bonding layer 30, solar cells 31 are sealed. Solar cells 31 are electrically connected to each other by wiring member 32. Back-side protective sheet member 20 has third principal surface 21 and fourth principal surface 22, and third principal surface 21 and fourth principal surface 22 are opposed to each other.

Front-side transparent protective member 10 can include a transparent resin base plate and the like, such as a glass plate, an acrylic plate and a polycarbonate plate, for example. Bonding layer 30 can be made of cross-linked resin such as ethylene vinyl acetate (EVA) copolymer or non-cross-linked resin such as polyolefin, or the like.

In this embodiment, back-side protective sheet member 20 is made of a sheet material having a thermal contraction rate of 1% or more. As such a sheet material, a resin sheet material is generally used. The thermal contraction rate of the sheet material is measured by the following method. In a method that meets JIS-C-2151 and ASTMDD-1204 standards, a test piece to be measured is first prepared, and the length of the test piece before heating is measured. Here, the length of the test piece before the test is denoted as Lo. In the method that meets JIS-C-2151 standards, the size of 100 mm×100 mm is used as typical dimensions of the test piece. Then, the test piece is hung in a no-load state at a specified temperature for a specified period of time in a constant temperature tank of a circulating hot air type. Next, the test piece is cooled to room temperature, the length thereof is measured. As for the length of the test piece, the same portion as that measured in the first step is measured. The length of the test piece after the test is denoted as L. A dimension change rate is calculated from the length Lo of the test piece before the test and the length L of the test piece after the test, thereby obtaining a value of thermal contraction rate. The dimension change rate can be calculated from the formula: (Lo−L)/Lo×100.

The upper limit of the thermal contraction rate of back-side protective sheet member 20 is not particularly limited, but is preferably 2.0% or less, in general.

As the sheet member having the thermal contraction rate of 1% or more, a sheet member before thermal contraction is available. Generally, as the back-side protective sheet member used in the solar cell module, a resin sheet such as polyvinylidene fluoride (PVF), polyethylene terephthalate (PET) and polytetrafluoroethylene (PEFE) is used. In manufacturing of the solar cell module, a cross-linked resin or non-cross-linked resin sheet to be bonding layer 30 is laminated on front-side transparent protective member 10, and solar cells 31 electrically connected by wiring member 32 are disposed thereon. Thereafter, a cross-linked resin or non-cross-linked resin sheet to be bonding layer 30 and back-side protective sheet member 20 are laminated thereon, and then pressurized and heated.

In order to prevent thermal contraction of the resin sheet in the heating step described above, the resin sheet to be used as back-side protective sheet member is conventionally preheated and thermally contracted. In this embodiment, such a resin sheet can be used in a state before thermal contraction without preheating. Therefore, in this embodiment, a resin sheet before thermal contraction, such as polyvinylidene fluoride (PVF), polyethylene terephthalate (PET) and polytetrafluoroethylene (PTFE), can be used as back-side protective sheet member 20. However, the sheet member is not limited to such resin sheets, but any other sheet member can also be used as long as the thermal contraction rate is 1% or more.

The solar cell module of this embodiment is manufactured using a PET resin sheet (thermal contraction rate of 1.7% and thickness of 130 μm) before thermal contraction as back-side protective sheet member 20. To be more specific, front-side transparent protective member 10 made of a glass plate, in which the surface area of first principal surface 11 is 1.007 times the projected area, is used, and the respective members are sequentially laminated thereon so as to form bonding layer 30. Thereafter, back-side protective sheet member 20 described above is laminated thereon, and then pressurized and heated. The heating temperature is 120° C. As a result, wrinkles hardly occur on back-side protective sheet member 20. It is considered that occurrence of wrinkles on back-side protective sheet member 20 can be inhibited since back-side protective sheet member 20 is thermally contracted and the surface area of at least one of third principal surface 21 and fourth principal surface 22 of back-side protective sheet member 20 is contracted by about 1.7%, during heating back-side protective sheet member 20.

For comparison, a solar cell module of a comparative example is manufactured in the same manner as the above embodiment, using a PET resin sheet (thermal contraction rate of about 0% and thickness of 130 μm), which is thermally contracted beforehand. As a result, a large number of wrinkles occur on back-side protective sheet member 20.

The thickness of back-side protective sheet member 20 is preferably within a range of 100 to 350 μm, and more preferably within a range of 130 to 210 μm from the viewpoint of further inhibiting the occurrence of wrinkles.

(Second Embodiment)

Figure 3:
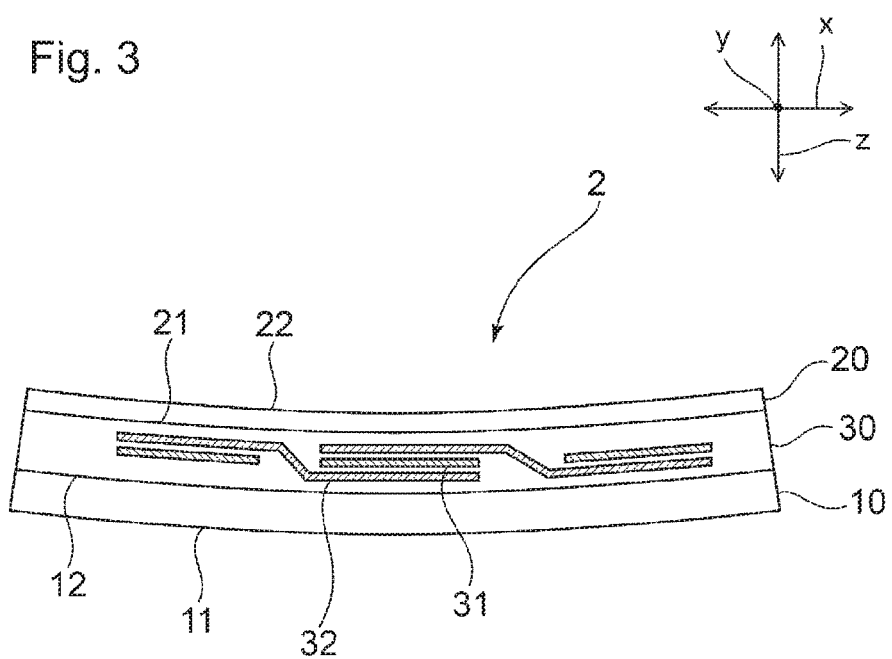
FIG. 3 is a schematic cross-sectional view illustrating a solar cell module according to second and fourth embodiments.

FIG. 3 is a schematic cross-sectional view illustrating a solar cell module according to a second embodiment. As illustrated in FIG. 3, solar cell module 2 of this embodiment uses front-side transparent protective member 10 having a shape protruding in a z-direction. Front-side transparent protective member 10 has first principal surface 11 to be a light-receiving surface and second principal surface 12 to be a back surface. First principal surface 11 and second principal surface 12 are opposed to each other.

Figure 4A:
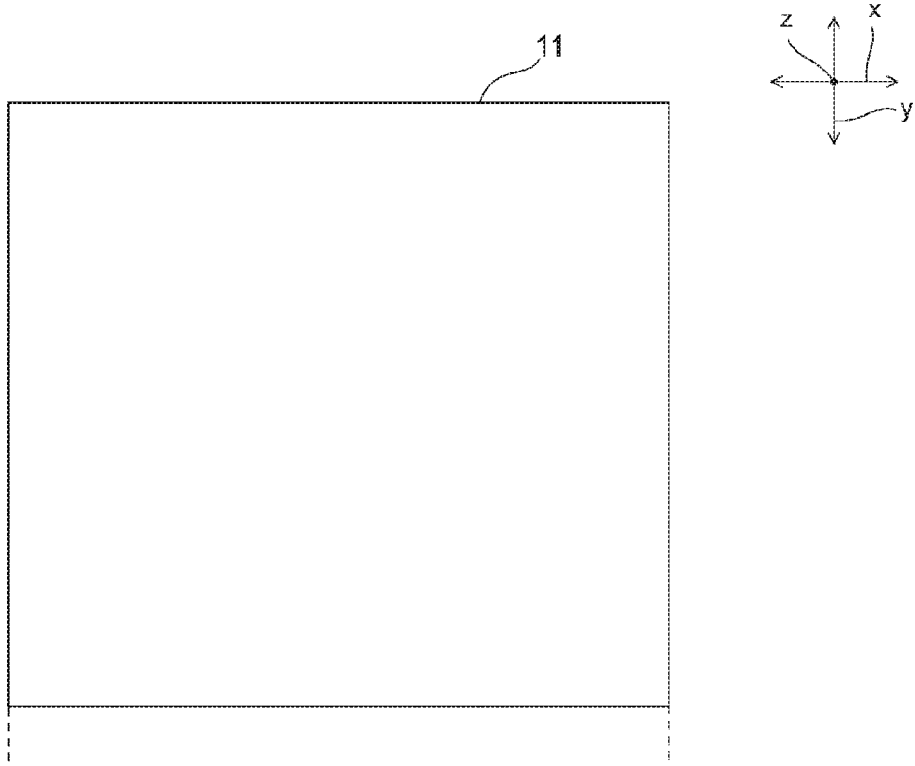
FIG. 4A is a projection view and FIG. 4B is a side view, illustrating a first principal surface of a front-side transparent protective member according to the second and fourth embodiments.
Figure 4B:
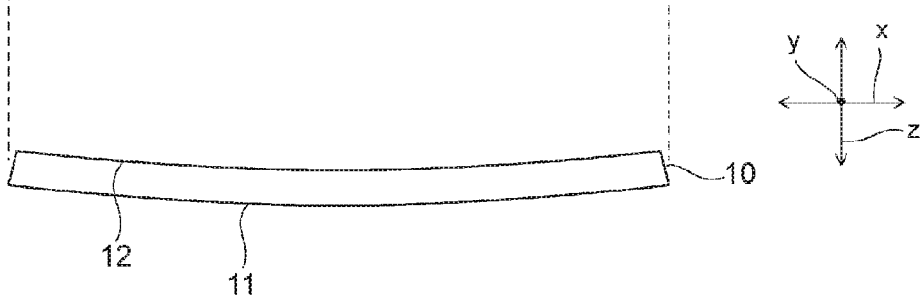

FIG. 4A is a projection view and FIG. 4B is a side view, illustrating first principal surface 11 of front-side transparent protective member 10 according to the second embodiment. FIG. 4A illustrates a projected area of first principal surface 11 of front-side transparent protective member 10. The surface area of first principal surface 11 of front-side transparent protective member 10 is larger than the projected area. In this embodiment, first principal surface 11 and second principal surface 12 have approximately the same bent shape.

It is preferable that a ratio of the surface area to the projected area of first principal surface 11 of front-side transparent protective member 10 in this embodiment is also the same as that in the first embodiment.

As illustrated in FIG. 3, also in solar cell module 2 of this embodiment, bonding layer 30 is provided between second principal surface 12 of front-side transparent protective member 10, which has a bent shape, and third principal surface 21 of back-side protective sheet member 20, as in the case of the first embodiment.

As back-side protective sheet member 20 and front-side transparent protective member 10 in this embodiment, the same members as back-side protective sheet member 20 and front-side transparent protective member 10 in the first embodiment can be used.

The solar cell module of this embodiment is manufactured using a PET resin sheet (thermal contraction rate of 1.7% and thickness of 130 μm) before thermal contraction as back-side protective sheet member 20. To be more specific, front-side transparent protective member 10 made of a glass plate, in which the surface area of first principal surface 11 is 1.007 times the projected area, is used. Then, a cross-linked resin or non-cross-linked resin sheet to be bonding layer 30 is laminated thereon, and solar cells 31 electrically connected by wiring member 32 are disposed thereon. Thereafter, a cross-linked resin or non-cross-linked resin sheet to be bonding layer 30 and back-side protective sheet member 20 described above are laminated thereon, and then pressurized and heated. The heating temperature is 120° C. As a result, wrinkles hardly occur on back-side protective sheet member 20.

For comparison, a solar cell module of a comparative example is manufactured in the same manner as the above embodiment, using a PET resin sheet (thermal contraction rate of about 0% and thickness of 130 μm), which is thermally contracted beforehand. As a result, a large number of wrinkles occur on back-side protective sheet member 20.

(Third Embodiment)

This embodiment is the same as the first embodiment except that a sheet member having a breaking elongation of 300% or more is used as back-side protective sheet member 20. Therefore, a solar cell module of this embodiment is represented by the schematic cross-sectional view illustrated in FIG. 1.

In this embodiment, back-side protective sheet member 20 is made of a sheet material having a breaking elongation of 300% or more. As such a sheet material, a resin sheet material is generally used. The breaking elongation of the sheet material is measured by the following method. In a method that meets JIS-C-2151 and ASTM-D-882 standards, a test piece to be measured is first prepared, and the length of the test piece before deformation is measured. The length of the test piece before the test is denoted as Lo. It is preferable that the test piece has a width of 10 mm to 25 mm and a length of 150 mm or more. Then, a tensile tester is used to pull the test piece while maintaining a speed of 5 to 500 mm/min. The test piece is pulled until the test piece breaks, and the length of the test piece at break is obtained. The length of the test sample at break is denoted as L. A tensile elongation rate is calculated from the length Lo of the test piece before the test and the length L of the test piece at break, thereby obtaining a value of breaking elongation. The tensile elongation rate can be calculated from the formula: (Lo−L)/Lo×100.

As the sheet member having a breaking elongation of 300% or more, a sheet member made of polyamide resin or the like is available.

In this embodiment, the thickness of back-side protective sheet member 20 is preferably within a range of 250 to 420 μm, and more preferably 350 μm or more from the viewpoint of further inhibiting the occurrence of wrinkles.

The solar cell module of this embodiment is manufactured using a polyamide resin sheet (manufactured by ISOVOLTAIC AG, trade name "ICOSOLAR AAA 3554", thickness of 350 μm) as back-side protective sheet member 20. As a result of measuring the breaking elongation of the polyamide resin sheet, the breaking elongation is 300%. To be more specific, front-side transparent protective member 10 made of a glass plate, in which the surface area of first principal surface 11 is 1.007 times the projected area, is used. Then, a cross-linked resin or non-cross-linked resin sheet to be bonding layer 30 is laminated thereon, and solar cells 31 electrically connected by wiring member 32 are disposed thereon. Thereafter, a cross-linked resin or non-cross-linked resin sheet to be bonding layer 30 and back-side protective sheet member 20 described above are laminated thereon, and then pressurized and heated. The heating temperature is 120° C. As a result, wrinkles hardly occur on back-side protective sheet member 20.

In this embodiment, it is considered that occurrence of wrinkles on back-side protective sheet member 20 can be inhibited since back-side protective sheet member 20 having the breaking elongation of 300% or more is used and thus back-side protective sheet member 20 is elongated to follow the non-planar shape during lamination of back-side protective sheet member 20.

For comparison, a solar cell module of a comparative example is manufactured in the same manner as the above embodiment, using a PET resin sheet (breaking elongation of 0% and thickness of 130 μm), which is thermally contracted beforehand. As a result, a large number of wrinkles occur on back-side protective sheet member 20.

(Fourth Embodiment)

This embodiment is the same as the second embodiment except that a sheet member having a breaking elongation of 300% or more is used as back-side protective sheet member 20. Therefore, a solar cell module of this embodiment is represented by the schematic cross-sectional view illustrated in FIG. 3.

As back-side protective sheet member 20 and front-side transparent protective member 10 in this embodiment, the same members as back-side protective sheet member 20 and front-side transparent protective member 10 in the third embodiment can be used.

The solar cell module of this embodiment is manufactured using a polyamide resin sheet (manufactured by ISOVOLTAIC AG, trade name "ICOSOLAR AAA 3554", thickness of 350 μm) as back-side protective sheet member 20. As a result of measuring the breaking elongation of the polyamide resin sheet, the breaking elongation is 300%. To be more specific, front-side transparent protective member 10 made of a glass plate, in which the surface area of first principal surface 11 is 1.007 times the projected area, is used. Then, a cross-linked resin or non-cross-linked resin sheet to be bonding layer 30 is laminated thereon, and solar cells 31 electrically connected by wiring member 32 are disposed thereon. Thereafter, a cross-linked resin or non-cross-linked resin sheet to be bonding layer 30 and back-side protective sheet member 20 described above are laminated thereon, and then pressurized and heated. The heating temperature is 120° C. As a result, wrinkles hardly occur on back-side protective sheet member 20.

For comparison, a solar cell module of a comparative example is manufactured in the same manner as the above embodiment, using a PET resin sheet (breaking elongation of 0% and thickness of 130 μm), which is thermally contracted beforehand. As a result, a large number of wrinkles occur on back-side protective sheet member 20.

In the respective embodiments described above, the description is given of the example where the shape that is not planar along the x-direction, as illustrated in FIG. 1 or FIG. 3, is used as the shape of second principal surface 12 of front-side transparent protective member 10. However, the invention is not limited thereto, but the shape of second principal surface 12 of front-side transparent protective member 10 may be a three-dimensional bent shape that is bent along the x-direction and y-direction.

REFERENCE SIGNS LIST

1, 2 solar cell module
10 front-side transparent protective member
11 first principal surface
12 second principal surface
20 back-side protective sheet member
21 third principal surface
22 fourth principal surface
30 bonding layer
31 solar cell
32 wiring member

The invention claimed is:

1. A solar cell module manufacturing method comprising:
preparing a front-side transparent protective member and a back-side protective sheet member, the front-side transparent protective member comprising a first principal surface and a second principal surface, a surface area of the first principal surface being larger than a projected area of the first principal surface, a surface area of the second principal surface being larger than a projected area of the second principal surface, the back-side protective sheet member comprising a third principal surface and a fourth principal surface, a surface area of the third principal surface being larger than a projected area of the third principal surface, a surface area of the fourth principal surface being larger than a projected area of the fourth principal surface; and
disposing solar cells between the second principal surface of the front-side transparent protective member and the third principal surface of the back-side protective sheet member, and sealing the solar cells with a bonding layer therebetween such that the solar cells comprise a first solar cell and a second solar cell, a negative value being calculated by multiplying a slope of a tangent line to a main surface of the first solar cell by a slope of a tangent line to a main surface of the second solar cell with respect to a horizontal plane in a cross sectional view of the solar cell module, wherein a thermal contraction rate of the back-side protective sheet member is 1% or more.

2. The solar cell module manufacturing method according to claim 1, wherein
the sealing of the solar cells in the bonding layer comprises heating and pressurizing a laminated body of the front-side transparent protective member, the solar cells and the back-side protective sheet member.

3. The solar cell module manufacturing method according to claim 2, wherein
in the heating and pressurizing of the laminated body of the front-side transparent protective member, the solar cells and the back-side protective sheet member, a surface area of at least one of the third principal surface and the fourth principal surface of the back-side protective sheet member is contracted by 1% or more.

4. The solar cell module manufacturing method according to claim 3, wherein
a thickness of the back-side protective sheet member is 130 μm or more.

5. The solar cell module manufacturing method according to claim 1, wherein:
the front-side transparent protective member is bent such that the first principal surface facing an opposite direction to the solar cells is convex and the second principal surface facing the solar cells is concave.

6. The solar cell module manufacturing method according to claim 1, wherein:
the front-side transparent protective member is thicker than the back-side protective sheet member.

7. The solar cell module manufacturing method according to claim 1, wherein a surface area is larger in this order of the first principal surface, the second principal surface, the third principal surface, and the fourth principal surface.

8. The solar cell module manufacturing method according to claim 1, wherein
the sealing of the solar cells in the bonding layer comprises heating and pressurizing a laminated body of the front-side transparent protective member, the solar cells and the back-side protective sheet member, the solar cells being electrically connected by a wiring member, and
in the heating and pressurizing of the laminated body of the front-side transparent protective member, the solar cells and the back-side protective sheet member,
the laminated body of the front-side transparent protective member, the solar cells and the back-side protective sheet member includes a bent shape, wherein the first solar cell and the second solar cell are adjacent each other with a bend point of the bent shape therebetween along a longitudinal direction of the wiring member, or
the laminated body of the front-side transparent protective member, the solar cells and the back-side protective sheet member includes a curved shape, wherein the first solar cell and the second solar cell are adjacent each other along the longitudinal direction of the wiring member.

9. The solar cell module manufacturing method according to claim 1, wherein
the sealing of the solar cells in the bonding layer comprises heating and pressurizing a laminated body of the front-side transparent protective member, the solar cells and the back-side protective sheet member, and
in the heating and pressurizing of the laminated body of the front-side transparent protective member, the solar cells and the back-side protective sheet member, the laminated body of the front-side transparent protective member, the solar cells and the back-side protective sheet member includes a curved shape in a portion where at least one of the solar cells is disposed.

10. The solar cell module manufacturing method according to claim 1, wherein
the sealing of the solar cells in the bonding layer comprises heating and pressurizing a laminated body of the front-side transparent protective member, the solar cells and the back-side protective sheet member, and
in the heating and pressurizing of the laminated body of the front-side transparent protective member, the solar cells and the back-side protective sheet member, the back-side protective sheet member in a state before thermal contraction without preheating is heated.

11. A solar cell module manufacturing method comprising:
preparing a front-side transparent protective member and a back-side protective sheet member, the front-side transparent protective member comprising a first principal surface and a second principal surface, a surface area of the first principal surface being larger than a projected area of the first principal surface, a surface area of the second principal surface being larger than a projected area of the second principal surface, the back-side protective sheet member comprising a third principal surface and a fourth principal surface, a surface area of the third principal surface being larger than a projected area of the third principal surface, a surface area of the fourth principal surface being larger than a projected area of the fourth principal surface; and
disposing solar cells between the second principal surface of the front-side transparent protective member and the third principal surface of the back-side protective sheet member, and sealing the solar cells with a bonding layer therebetween such that the solar cells comprise a first solar cell and a second solar cell, a negative value being calculated by multiplying a slope of a tangent line to a main surface of the first solar cell by a slope of a tangent line to a main surface of the second solar cell with respect to a horizontal plane in a cross sectional view of the solar cell module, wherein
a breaking elongation of the back-side protective sheet member is 300% or more.

12. The solar cell module manufacturing method according to claim 11, wherein:
the front-side transparent protective member is bent such that the first principal surface facing an opposite direction to the solar cells is convex and the second principal surface facing the solar cells is concave.

13. The solar cell module manufacturing method according to claim 11, wherein:
the front-side transparent protective member is thicker than the back-side protective sheet member.

14. A solar cell module manufacturing method comprising:
preparing a front-side transparent protective member and a back-side protective sheet member, the front-side transparent protective member comprising a first principal surface and a second principal surface, a surface area of the first principal surface being larger than a projected area of the first principal surface, the back-side protective sheet member comprising a third principal surface and a fourth principal surface; and
disposing a solar cell between the second principal surface of the front-side transparent protective member and the third principal surface of the back-side protective sheet member, and sealing the solar cell with a bonding layer therebetween, wherein
the sealing of the solar cell in the bonding layer comprises heating and pressurizing a laminated body of the front-side transparent protective member, the solar cell and the back-side protective sheet member,
in the heating and pressurizing of the laminated body of the front-side transparent protective member, the solar cell and the back-side protective sheet member, the back-side protective sheet member in a state before thermal contraction without preheating is heated, and
a thermal contraction rate of the back-side protective sheet member is 1% or more.

15. The solar cell module manufacturing method according to claim 14, wherein a thickness of the back-side protective sheet member is 130 µm or more.

16. The solar cell module manufacturing method according to claim 14, wherein the front-side transparent protective member is bent such that the first principal surface facing an opposite direction to the solar cell is convex and the second principal surface facing the solar cell is concave.

17. The solar cell module manufacturing method according to claim 14, wherein the front-side transparent protective member is thicker than the back-side protective sheet member.

18. A solar cell module manufacturing method comprising:
preparing a front-side transparent protective member and a back-side protective sheet member, the front-side transparent protective member comprising a first principal surface and a second principal surface, a surface area of the first principal surface being larger than a projected area of the first principal surface, the back-side protective sheet member comprising a third principal surface and a fourth principal surface; and
disposing solar cells between the second principal surface of the front-side transparent protective member and the third principal surface of the back-side protective sheet member, and sealing the solar cells with a bonding layer therebetween such that the solar cells comprise a first solar cell and a second solar cell, a negative value being calculated by multiplying a slope of a tangent line to a main surface of the first solar cell by a slope of a tangent line to a main surface of the second solar cell with respect to a horizontal plane in a cross sectional view of the solar cell module, wherein
the sealing of the solar cells in the bonding layer comprises heating and pressurizing a laminated body of the front-side transparent protective member, the solar cells and the back-side protective sheet member,
in the heating and pressurizing of the laminated body of the front-side transparent protective member, the solar cells and the back-side protective sheet member, the laminated body of the front-side transparent protective member, the solar cells and the back-side protective sheet member includes a bent shape or a curved shape, and
a thermal contraction rate of the back-side protective sheet member is 1% or more.

19. The solar cell module manufacturing method according to claim 18, wherein a thickness of the back-side protective sheet member is 130 µm or more.

20. The solar cell module manufacturing method according to claim 18, wherein the laminated body of the front-side transparent protective member, the solar cells and the back-side protective sheet member includes a bent shape or a curved shape such that the first principal surface facing an opposite direction to the solar cells is convex and the second principal surface facing the solar cells is concave.

* * * * *